United States Patent
Bu et al.

(10) Patent No.: US 7,447,064 B1
(45) Date of Patent: Nov. 4, 2008

(54) SYSTEM AND METHOD FOR PROVIDING A CMOS COMPATIBLE SINGLE POLY EEPROM WITH AN NMOS PROGRAM TRANSISTOR

(75) Inventors: Jiankang Bu, Windham, ME (US); Lee Jacobson, Cape Elizabeth, ME (US); David Courtney Parker, Topsham, ME (US)

(73) Assignee: National Semiconductor Corporation, Santa Clara, CA (US)

( * ) Notice: Subject to any disclaimer, the term of this patent is extended or adjusted under 35 U.S.C. 154(b) by 64 days.

(21) Appl. No.: 11/389,984

(22) Filed: Mar. 27, 2006

(51) Int. Cl.
*G11C 11/34* (2006.01)

(52) U.S. Cl. .......................... 365/185.01; 365/185.18; 365/185.05; 257/315

(58) Field of Classification Search ............ 365/185.01, 365/185.18, 185.05; 257/314, 315
See application file for complete search history.

(56) References Cited

U.S. PATENT DOCUMENTS

| 6,853,583 | B2 | 2/2005 | Diorio et al. |
| 6,950,342 | B2 | 9/2005 | Lindhorst et al. |
| 2007/0097743 | A1 * | 5/2007 | Fang et al. ............. 365/185.02 |

OTHER PUBLICATIONS

Nader Akil et al., "Optimization of Embedded Compact Nonvolatile Memories for Sub-100-nm CMOS Generations", IEEE Transactions on Electron Devices, vol. 52, No. 4, Apr. 2005, pp. 492-499.

A. Hoefler et al., "Statistical Modeling of the Program/Erase Cycling Acceleration of Low Temperature Data Retention in Floating Gate Nonvolatile Memories", IEEE 40th Annual International Reliability Physics Symposium, Dallas, Texas, 2002, pp. 21-25.

Margaret L. French et al., "Design and Scaling of a SONOS Multidielectric Device for Nonvolatile Memory Applications", IEEE Transactions on Components, Packaging, and Manufacturing Technology-Part A, vol. 17, No. 3, Sep. 1994, pp. 390-397.

Yang (Larr) Yang et al., "Charge Retention of Scaled SONOS Nonvolatile Memory Devices at Elevated Temperatures", Solid-Sate Electronics 44 (2000), pp. 949-958.

L. Chang et al., "Non-Volatile Memory Device with True CMOS Compatibility", Electronics Letters, vol. 35, No. 17, Aug. 19, 1999, pp. 1443-1445.

* cited by examiner

*Primary Examiner*—Huan Hoang

(57) ABSTRACT

A system and method is disclosed for providing a CMOS compatible single poly electrically erasable programmable read only memory (EEPROM) with memory cells that comprise an NMOS program transistor. In a first embodiment the memory cells of the EEPROM comprise a PMOS control capacitor. In a second embodiment the memory cells of the EEPROM comprise an NMOS control capacitor. A well bias voltage is applied to the NMOS program transistor instead of a gate bias voltage. The well bias voltage enables the injection of (1) channel hot electrons, (2) second hot electrons initiated by the channel hot electrons, and (3) drain impact ionization hot electrons into a floating gate of the NMOS program transistor.

20 Claims, 6 Drawing Sheets

SYSTEM AND METHOD FOR PROVIDING A CMOS COMPATIBLE SINGLE POLY EEPROM WITH AN NMOS PROGRAM TRANSISTOR

TECHNICAL FIELD OF THE INVENTION

The present invention is generally directed to the manufacture of integrated circuits and, in particular, to a system and method for providing an improved high density electrically erasable programmable read only memory (EEPROM) device.

BACKGROUND OF THE INVENTION

A fundamental design challenge in creating a memory cell of an electrically erasable programmable read only memory (EEPROM) device is to use a controllable and reproducible electrical effect that has sufficient non-linearity so that the memory cell (1) can be written to (or erased) at one voltage in less than one millisecond (1 ms) and can be read at another voltage, and (2) the data within the memory cell must remain unchanged for more than ten (10) years.

Prior art stacked/split gate EEPROM technology requires (1) special multi-polysilicon materials, (2) different gate oxide thicknesses, and (3) modified doping profiles. These prior art requirements create process complexity and high cost when embedded into a complementary metal oxide semiconductor (CMOS) process.

FIG. 1 illustrates a schematic diagram of a prior art memory cell 100 of a single poly erasable programmable read only memory (EEPROM) device. Memory cell 100 comprises one P-channel metal oxide semiconductor (PMOS) transistor 110 and one P-channel metal oxide semiconductor (PMOS) capacitor 120. The PMOS capacitor 120 is formed by connecting together the source, drain and substrate of a PMOS transistor. A cross sectional view 200 of the memory cell 100 is shown in FIG. 2.

The PMOS transistor 110 may be referred to as PMOS program transistor 110. The PMOS capacitor 120 may be referred to as PMOS control capacitor 120. The gate of the PMOS program transistor 110 and the gate of the PMOS control capacitor 120 are connected together (i.e., shorted together) and are isolated from the other active elements. The shorted gates of the PMOS program transistor 110 and the PMOS control capacitor 120 are collectively referred to as a "floating gate" 130. Charges (in amounts that represent either a zero (0) representation or a one (1) representation) may be written to the floating gate 130. In order to avoid well bias interference, the PMOS program transistor 110 and the PMOS control capacitor 120 are each located in a separate N well.

The prior art memory cell 100 is written to by injecting drain avalanche hot electrons into the floating gate 130. For PMOS operation (as shown in FIG. 1 and in FIG. 2) low voltage is applied to the control gate and drain of PMOS control capacitor 120 and high voltage is applied to the source/well of PMOS program transistor 110. The channel PMOS program transistor 110 is turned on and hot electrons are generated at the high electric field region at the drain junction (designated "$V_{inj}$" in FIG. 1). With positive voltage on the control gate of PMOS control transistor 120, some hot electrons with high energy will pass through the silicon-silicon dioxide (Si—SiO$_2$) potential barrier and be injected into the floating gate 130.

The prior art memory cell 100 is erased by applying a high voltage to the control gate of the PMOS control transistor 120 and to the ground drain and source of the PMOS program transistor 110. Electrons on the floating gate 130 will pass through the gate oxide between the floating gate 130 and the control gate of the PMOS control capacitor 120 by Fowler-Nordheim (FN) tunneling process and go to the substrate.

During programming, most control gate voltage should be coupled between the floating gate 130 and the drain/source of the PMOS program transistor 110 to facilitate electron injection to the floating gate 130 but not further to the control gate of the PMOS control transistor 120. This requires the capacitance between the floating gate 130 and the control gate to be large. On the other hand, during the erase procedure, more control gate voltage should be coupled between the floating gate 130 and the control gate, so that electrons can tunnel from the floating gate 130 to the substrate by the Fowler-Nordheim (FN) tunneling process. This requires the capacitance between the floating gate 130 and the control gate to be small.

These two contradictory requirements for the control gate capacitance during the program procedure and the erase procedure leave a narrower operation window. This results in poor data retention and slower speeds for an EEPROM that comprises one PMOS program transistor and one PMOS control capacitor.

To improve the operational speed and data retention for a single poly EEPROM device, EEPROM designers have sometimes placed an additional capacitor in the basic memory cell. This approach has one large capacitor for the programming operation and one small capacitor for the erase operation. Capacitor coupling techniques are used to achieve a favorable electric field for both the programming operation and the erase operation.

The floating gate of an added capacitor has to be filled with hot electrons. Hot electrons that pass through gate oxide will create oxide damage. Oxide damage degrades the endurance of a memory cell. Endurance is measured by how many program/erase cycles the gate oxide can tolerate before unacceptable damage occurs. Therefore, one major drawback to adding an extra capacitor is that it degrades EEPROM memory cell endurance performance.

Another drawback to adding an extra capacitor is that it significantly increases the size of the basic memory cell. This significantly lowers the EEPROM density. Additional chip area is required for the extra capacitors. This increases the cost.

Another drawback of prior art CMOS EEPROM technology is the speed of the programming procedure. The programming procedure is carried out by utilizing drain avalanche hot electrons. Because the efficiency of generating and injecting the drain avalanche hot electrons is low, programming times are relatively long. The programming time is usually one hundred milliseconds (100 ms) or longer. Even the improved coupling provided by using additional capacitors only reduces the programming time to about twenty milliseconds (20 ms).

Therefore, there is a need in the art for an improved system and method for providing an improved high density electrically erasable programmable read only memory (EEPROM) device. In particular, there is a need in the art for an improved system and method for achieving a favorable electric field for both the programming operation and the erase operation of a memory cell in an EEPROM device without employing an additional capacitor in the memory cell.

Before undertaking the Detailed Description of the Invention below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like.

Definitions for certain words and phrases are provided throughout this patent document, those of ordinary skill in the art should understand that in many, if not most instances, such definitions apply to prior uses, as well as to future uses, of such defined words and phrases.

BRIEF DESCRIPTION OF THE DRAWINGS

For a more complete understanding of the present invention and its advantages, reference is now made to the following description taken in conjunction with the accompanying drawings, in which like reference numerals represent like parts.

DETAILED DESCRIPTION OF THE INVENTION

FIGS. 3 through 15, discussed below, and the various embodiments used to describe the principles of the present invention in this patent document are by way of illustration only and should not be construed in any way to limit the scope of the invention. Those skilled in the art will understand that the principles of the present invention may be implemented with any type of suitably arranged electrically erasable programmable read only memory (EEPROM) device.

Figure 1:
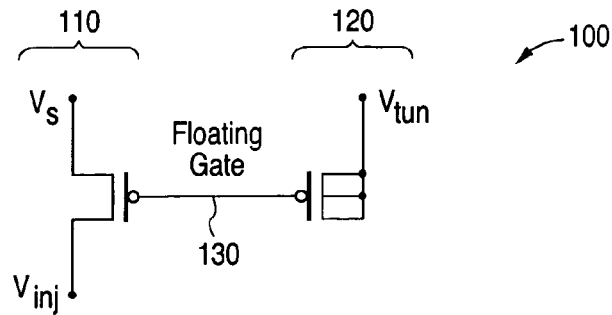
FIG. 1 illustrates a schematic diagram of a prior art memory cell of a single poly erasable programmable read only memory (EEPROM) device.
Figure 2:
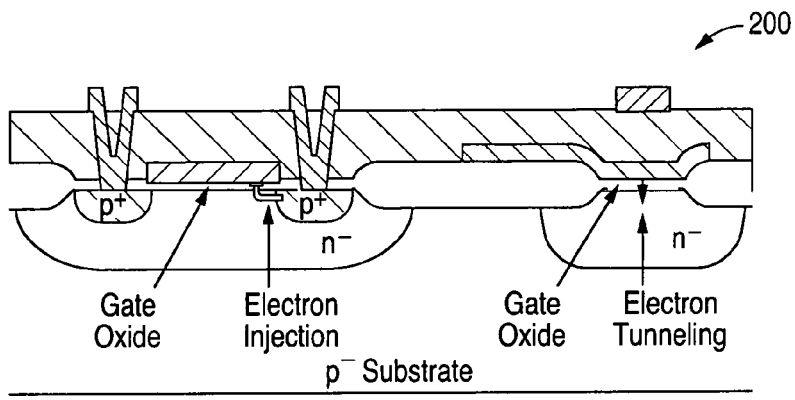
FIG. 2 illustrates a cross sectional view of the prior art memory cell shown schematically in FIG. 1.
Figure 3:
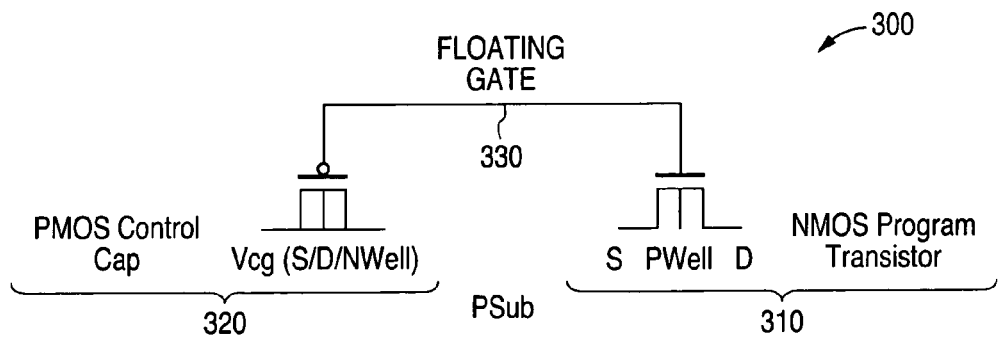
FIG. 3 illustrates a schematic diagram of one advantageous embodiment of a memory cell of a single poly erasable programmable read only memory (EEPROM) device of the present invention comprising an NMOS program transistor and a PMOS control capacitor.

FIG. 3 illustrates a schematic diagram of one advantageous embodiment of a memory cell 300 of a single poly erasable programmable read only memory (EEPROM) device of the present invention. Memory cell 300 comprises an NMOS program transistor 310 and a PMOS control capacitor 320. The gate of the NMOS program transistor 310 and the gate of the PMOS control capacitor 320 are connected together (i.e., shorted together) and are isolated from the other active elements. The shorted gates of the NMOS program transistor 310 and the PMOS control capacitor 320 are collectively referred to as a "floating gate" 330. Electrical charges (in amounts that represent either a zero (0) representation or a one (1) representation) may be written to the floating gate 330. In order to avoid well bias interference, the NMOS program transistor 310 is located in a P well and the PMOS control capacitor 120 is located in a separate N well.

Figure 4:
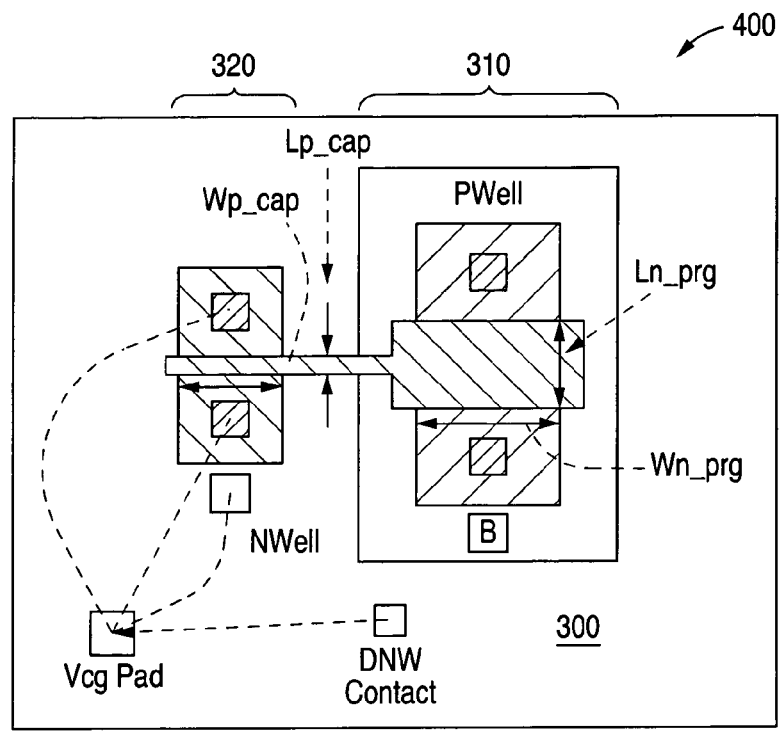
FIG. 4 illustrates a plan view of a memory cell layout design of a memory cell of the present invention shown in FIG. 3.

FIG. 4 illustrates a plan view of a memory cell layout design 400 of the memory cell 300. The letters "Wp_cap" represent the width of the PMOS control capacitor 320 and the letters "Lp_cap" represent the length of the PMOS control capacitor 320. The letters "Wn_prg" represent the width of the NMOS program transistor 310 and the letters "Ln_prg" represent the length of the NMOS program transistor 310. A Deep N Well (designated "DNW") (shown in FIG. 5) underlies the P Well of the NMOS program transistor 310. The contact designated with the letter "B" in FIG. 4 represents the connection point for a well bias voltage to be applied to the NMOS program transistor 310.

Figure 5:
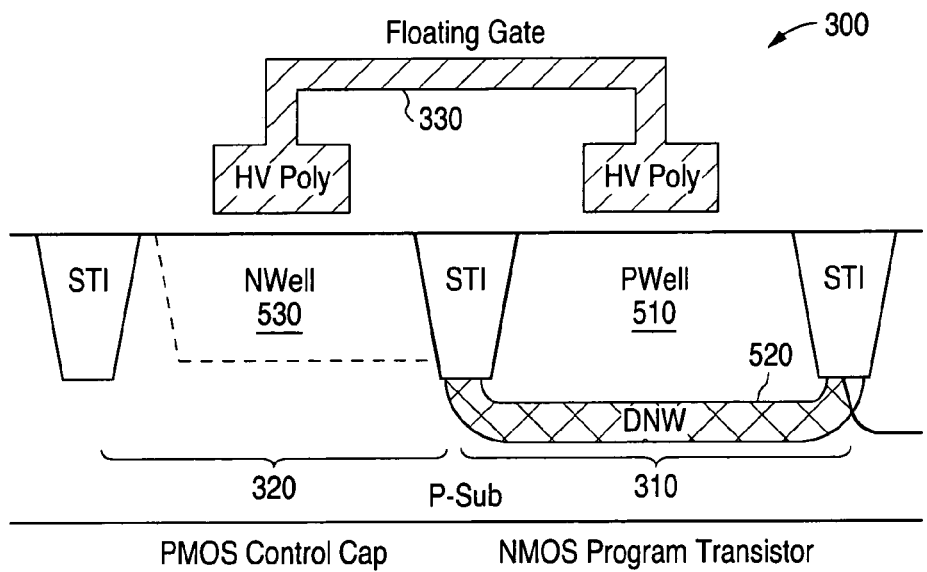
FIG. 5 illustrates a cross sectional view of a memory cell of the present invention shown in FIG. 3.

FIG. 5 illustrates a cross sectional view of the memory cell 300. As shown in FIG. 5, the NMOS program transistor 310 is located in P Well 510 over Deep N Well 520. PMOS control capacitor 320 is located in N Well 530. The NMOS program transistor 310 and the PMOS control capacitor 320 are isolated by shallow trench isolation structures (designated with the letters "STI" in FIG. 5).

The advantageous embodiment of the memory cell 300 of the invention shown in FIGS. 3, 4 and 5 comprises one NMOS program transistor 310 and one PMOS control capacitor 320. As previously mentioned, the source, drain and well of the PMOS control capacitor 320 are connected together. The PMOS control capacitor 320 serves as the erase/control gate capacitor.

The present invention circumvents the different coupling ratio requirements during the program procedure and the erase procedure by applying well bias to the NMOS program transistor 310. The well bias in the NMOS program transistor 310 alleviates the coupling requirement during the program procedure. Therefore, the designer of the EEPROM device can focus on meeting the coupling requirement during the erase procedure and use only one capacitor.

Placing the NMOS program transistor 310 in an isolated P well 510 allows the memory cell 300 to be programmed (1) with channel hot electrons, and (2) with second channel hot electrons that are initiated by the channel hot electrons, and (3) with hot electrons from an enhanced drain avalanche mechanism that is due to the elevated drain/well bias. Prior art methods use only one source of hot electrons (i.e., channel hot electrons) in the programming procedure. The present invention's use of three sources of hot electrons in the programming procedure reduces the time required to complete the programming procedure.

In the NMOS program transistor 310 with well bias the drain current is reduced. This is due to the fact that the threshold voltage is increased for body effect.

The memory cell 300 of the present invention employs only one capacitor (PMOS control capacitor 320) as the erase/control gate. The capacitance of the PMOS control capacitor 320 is designed to be smaller than the gate capacitance of the NMOS program transistor 310. This feature increases the erase speed due to enhanced Fowler-Nordheim (FN) tunneling electric field as a result of the favorable coupling ratio for the erase operation.

The PMOS control capacitor 320 is isolated in its own N Well 530. For the NMOS program transistor 310 an isolated P Well 510 is required. In one advantageous embodiment a process flow is used to create a Deep N Well 520 under the isolated P Well 510. One feature of the Deep N Well 520 is that it reduces 1/f noise.

As previously mentioned, the present invention utilizes one NMOS transistor with well bias as the program transistor and only one capacitor as the erase/control gate.

During the programming procedure, (1) a positive voltage is applied to the erase/control gate and drain, and (2) a negative voltage is applied to the P Well 510 and source grounding. Hot electrons from the NMOS program transistor channel are injected into the floating gate 330. During the erase procedure, high voltage is applied to the erase/control gate and the other terminals are grounded. As shown in the memory cell layout design 400 in FIG. 4, the erase/control gate size is intentionally designed to be smaller. Therefore, most of the erase voltage will be coupled between the erase/control gate and the floating gate. The erase speed is increased due to enhanced Fowler-Nordheim tunneling current.

Because the present invention uses only one capacitor, less voltage is coupled between the floating gate 330 and the P Well 510 when the coupling ratio favors erase only. Programming speed will be lower if no measures are taken. As will be more fully described below, the present invention solves this problem by applying a P Well bias.

Figure 6:
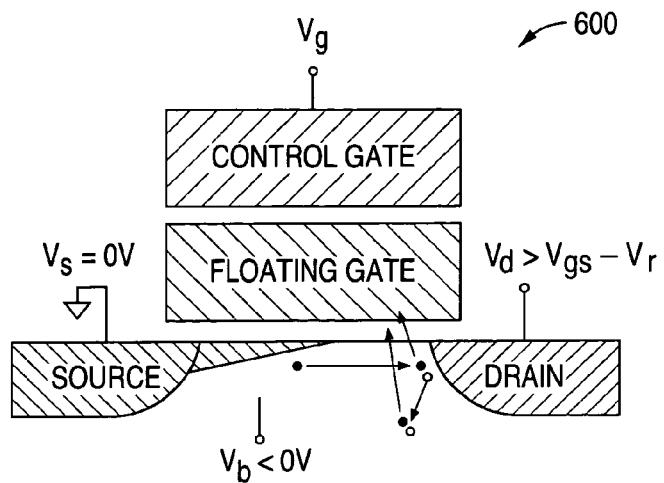
FIG. 6 illustrates a cross sectional view illustrating the physical mechanism of channel hot electron and second channel hot electron generation and injection.

As previously mentioned, the present invention uses three sources of hot electrons to increase the speed of the programming procedure. FIG. 6 illustrates a cross sectional view 600 illustrating the physical mechanism of channel hot electron and second channel hot electron generation and injection. When the P Well is biased, the vertical field in the substrate accelerates the holes that are created near the drain. Holes thereafter gain enough energy to create another electron-hole pair. The second electrons are accelerated toward the floating gate and will be injected into the floating gate. Due to the favorable field from the substrate, some first channel hot electrons may also gain enough energy and have an increased chance to be injected into the floating gate.

Figure 7:
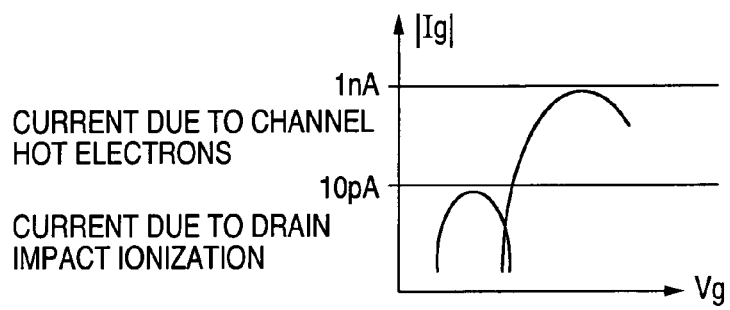
FIG. 7 illustrates a graph of gate current versus control gate voltage illustrating gate current values under two different hot electron injection regimes.

It is known from prior art experiments that have been performed on stacked gate flash memory devices, that the efficiency of channel hot electron generation and injection is much higher than that of drain avalanche hot carriers (DAHC) (also referred to as "drain impact ionization"). FIG. 7 illustrates a graph of gate current (Ig) versus control gate voltage (Vg) illustrating gate current values under two different hot electron injection regimes. The gate current due to the channel hot electrons reaches a maximum value near one nanoampere ($1.0 \times 10^{-9}$ A). The gate current due to the electrons from drain impact ionization reaches a maximum value near ten picoamperes ($10.0 \times 10^{-12}$ A) or ($1.0 \times 10^{-11}$ A). This shows that the gate current (Ig) that is due to the injection of channel hot electrons is two (2) orders of magnitude greater than the gate current (Ig) that is due to the injection of electrons due to drain impact ionization. Therefore, the gate current that is due to channel hot electrons can inject a given amount of charge to the floating gate in a shorter amount of time than the gate current that is due to the drain impact ionization.

In PMOS technology, the only available mechanism to generate hot carriers is the drain avalanche hot carrier (DAHC) mechanism. The mobility of holes flowing in the channel is too low. Therefore the holes cannot reach high enough speeds to pass the silicon-silicon dioxide (Si—$SiO_2$) barrier.

In stacked gate type flash memory, the drain is particularly engineered to favor the generation of channel hot electrons. The generation of channel hot electrons is only enough to inject enough electrons into the floating gate to cause more than a four volt (4 V) threshold voltage shift in less than ten microseconds (10 μs) of time. In a standard CMOS device, as used in the present invention, the drain is not particularly engineered (e.g., no special implant is formed) to favor the generation of channel hot electrons. Therefore, the generation rate for the hot channel electrons will be low.

With the applied well bias, the injection of electrons to the floating gate in the present invention comprises the injection of (1) channel hot electrons, and (2) second hot electrons initiated by channel hot electrons, and (3) drain impact ionization hot electrons. Under the same value of drain bias, the drain impact ionization hot electron generation rate is higher than that without well bias due to the elevated electric field with well bias at the drain edge.

If one just increases the drain bias without applying well bias, then more hot electrons can also be generated. However, higher drain bias will attract most of those hot electrons to the drain and prevent them from injecting to the floating gate. This approach will not increase the programming speed.

In the present invention with the well bias, the higher injection efficiency alleviates the requirement for a larger control gate capacitor. Therefore, the EEPROM designer can focus on meeting the requirement for better erase coupling. This improvement is made possible by the use of the NMOS program transistor 310 of the present invention.

The use of well bias in the present invention also enables the EEPROM designer to replace the gate bias voltage with the well bias voltage. For example, consider the circuit configuration shown in FIG. 8A. The source and the control gate are each at a voltage of two volts (2 V). The drain is at a voltage of five volts (5 V). The well is at a voltage of zero volts (0 V).

Figure 8A:
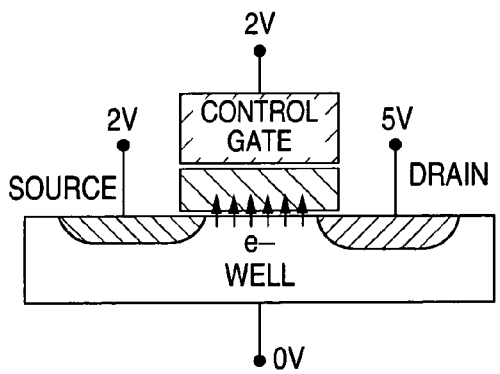
FIG. 8A illustrates a first circuit configuration illustrating the application of a gate bias voltage.
Figure 8B:
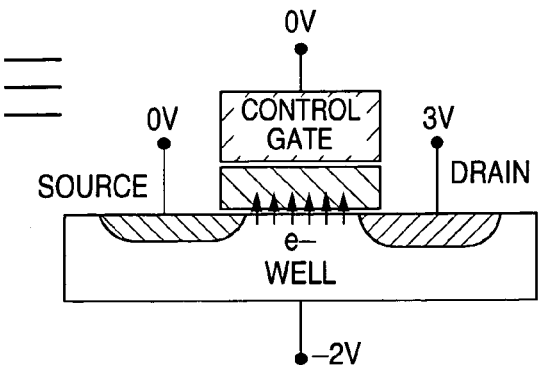
FIG. 8B illustrates a second circuit configuration that is equivalent to the first circuit configuration except that the gate bias voltage has been shifted to a well bias voltage.

When the gate bias is shifted to the well bias, the result is shown in circuit configuration shown in FIG. 8B. The source and the control gate are each at a voltage of zero volts (0 V). The drain is at a voltage of three volts (3 V). The well is at a voltage of negative two volts (−2 V).

In both the circuit configuration shown in FIG. 8A and the circuit configuration shown in FIG. 8B the source and the control gate are at the same potential. The potential from the well to the control gate is two volts (2 V). The potential from the control gate to the drain is three volts (3 V). The three horizontal lines between FIG. 8A and FIG. 8B signify that the two circuit configurations are equivalent.

The prior art memory cells typically operate with a voltage of four volts (4 V) on the floating gate. The prior art substrate is typically held at zero volts (0 V) and the prior art control gate voltage is ten volts (10 V). The present invention is also capable of operating with a voltage of four volts (4 V) on the floating gate. The present invention accomplishes this by placing a voltage of two volts (2 V) on the floating gate and a minus two volts (−2 v) on the substrate. The net result is an effective voltage of four volts (4 V) on the floating gate. This is because two volts (2 V) minus a negative two volts (−2 V) is a positive four volts (4 V). That is, [2 V−(−2 V)]=4 V.

Although the present invention is able to duplicate the four volt (4 V) operating voltage that is used in the prior art, the present invention is further capable of operating with two volts (2 V) on the floating gate (as shown in FIG. 8A and in FIG. 8B). Operating with a lower voltage on the floating gate means that a large control gate capacitor is not needed to couple a high voltage from the control gate to the floating gate. With all other device parameters the same, the larger the control gate capacitor, the higher the voltage that can be coupled to the floating gate. However, the use of a larger control gate capacitor has several drawbacks. First, a larger control gate capacitor degrades EEPROM memory cell endurance because it requires more hot electrons to fill it. Second, a larger control gate capacitor decreases the program/erase speed. Third, a larger control gate capacitor increases the size of the memory cell.

Another advantageous feature of the present invention is that applying the well bias reduces the channel current. When the P well bias is applied on the NMOS program transistor 310, the drain current is reduced because the threshold voltage is increased due to body effect. This feature enables the present invention to generate the same amount of hot electrons using less current than prior art devices. Because the present invention uses less current it requires less power to operate than prior art devices.

Another advantageous feature of the present invention is that the size of the NMOS program transistor 310 is larger than the size of the PMOS control capacitor 320. This feature significantly improves the endurance of the memory cell 300. Prior art PMOS capacitors are significantly larger than PMOS program transistors. For example, in some cases the size of a prior art PMOS capacitor may be twenty seven (27) times larger than the size of the prior art PMOS program transistor. This difference is size in prior art devices requires more electrons to be injected from the PMOS program transistor to the PMOS control capacitor in order to fill up the large PMOS control capacitor. This requirement leads to poor endurance for the prior art memory cell.

In the fabrication process that is used to make the memory cell 300 of the present invention, one important consideration is the design and manufacture of the P well 510. One possible design approach is to take no special steps to isolate the P Well 510. Because the PMOS control capacitor 310 is a PMOS transistor with its source, drain and N well tied together, the low bias voltage (from approximately minus one volt (−1 V) to minus three volts (−3 V)) will not affect the erase/control gate settings in the N Well 530. This low P Well bias may cause a small disturbance to the other EEPROM cells that are sharing the same P Well, but this disturbance is minimal and can be tolerated. In some embedded applications, there may be other logic transistors that share the same P Well. Under such circumstances, the P Well bias may cause serious trouble for the logic transistors.

A better design approach is to implant a Deep N Well 520 under the P Well 510 and isolate the P Well 510 by surrounding it with shallow trench isolation ("STI") structures. This approach can be carried out by National Semiconductor Corporation's CMOS9x process flow method or CMOS9t5v process flow method without process modification or any add-on cost.

Another consideration is that the N+ drain/P Well breakdown voltage should be high enough to tolerate the well bias. In the advantageous embodiment of the present invention, the voltage that is applied between the drain and the well is less than six volts (6 V). In standard CMOS processes, the N+ drain/P Well breakdown voltage is above eight volts (8 V). Therefore, there is enough margin to be able to apply the well bias voltage of the present invention. The well bias voltage of the present invention is between minus one volt (−1 V) and minus three volts (−3 V).

Figure 9:
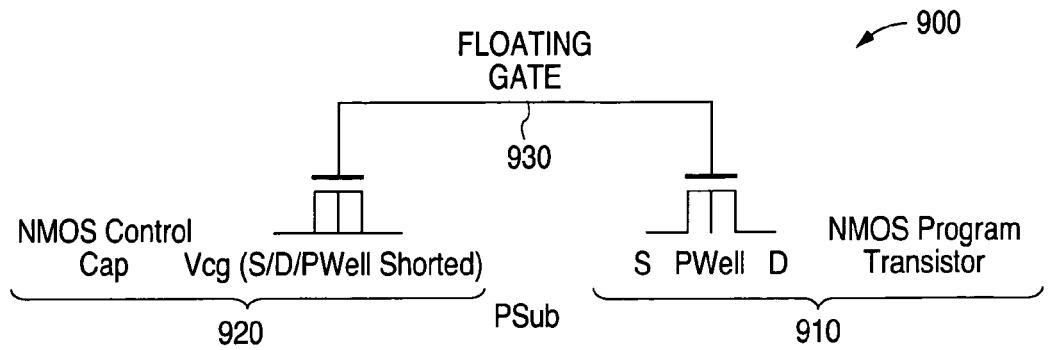
FIG. 9 illustrates a schematic diagram of another advantageous embodiment of a memory a memory cell of a single poly erasable programmable read only memory (EEPROM) device of the present invention comprising an NMOS program transistor and an NMOS control capacitor.

In another advantageous embodiment of the present invention the program transistor and the control capacitor both comprises NMOS transistors. FIG. 9 illustrates a memory cell 900 of a single poly erasable programmable read only memory (EEPROM) device illustrating this alternate embodiment. Memory cell 900 comprises an NMOS program transistor 910 and a NMOS control capacitor 920. The gate of the NMOS program transistor 910 and the gate of the NMOS control capacitor 920 are connected together (i.e., shorted together) and are isolated from the other active elements. The shorted gates of the NMOS program transistor 910 and the NMOS control capacitor 920 are collectively referred to as a "floating gate" 930. Electrical charges (in amounts that represent either a zero (0) representation or a one (1) representation) may be written to the floating gate 930. In order to avoid well bias interference, the NMOS program transistor 910 is located in a first P well and the NMOS control capacitor 920 is located in a separate second P well.

Figure 10:
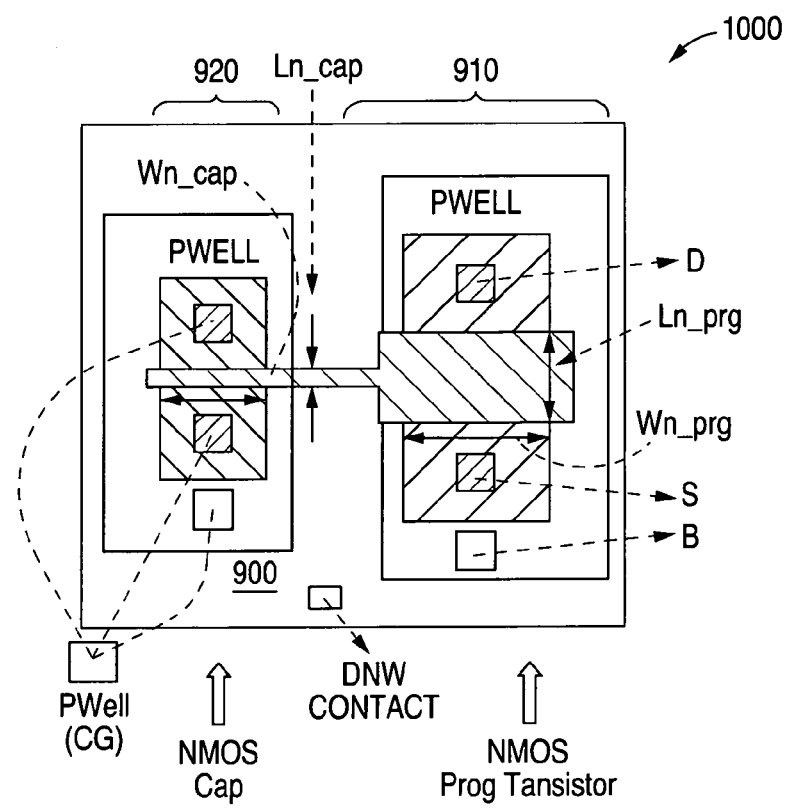
FIG. 10 illustrates a plan view of a memory cell layout design of a memory cell of the present invention shown in FIG. 9.

FIG. 10 illustrates a plan view of a memory cell layout design 1000 of the memory cell 900. The letters "Wn_cap" represent the width of the NMOS control capacitor 920 and the letters "Ln_cap" represent the length of the NMOS control capacitor 920. The letters "Wn_prg" represent the width of the NMOS program transistor 910 and the letters "Ln_prg" represent the length of the NMOS program transistor 910. A Deep N Well (designated "DNW") (shown in FIG. 11) underlies the first P Well of the NMOS program transistor 910 and the second P Well of the NMOS control capacitor 920. The contact designated with the letter "B" in FIG. 10 represents the connection point for a well bias voltage to be applied to the NMOS program transistor 910.

Figure 11:
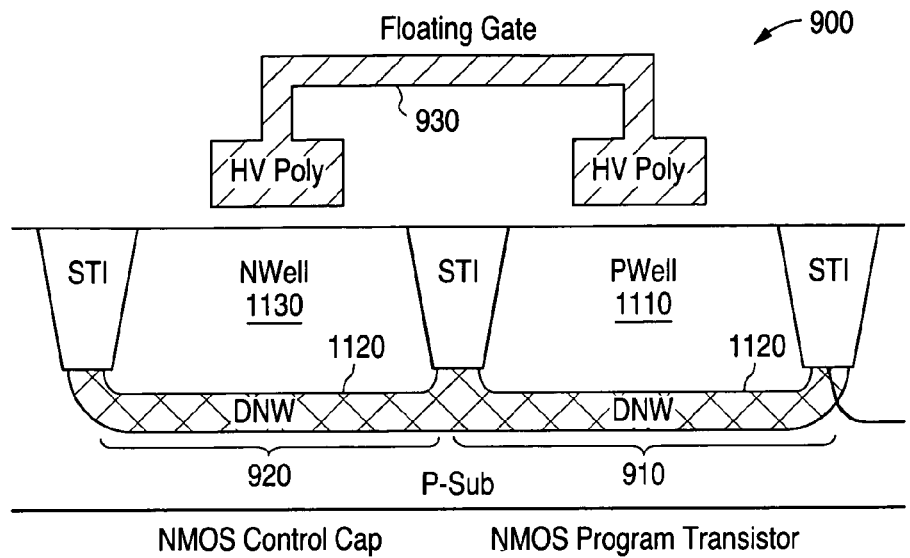
FIG. 11 illustrates a cross sectional view of a memory cell of the present invention shown in FIG. 9.

FIG. 11 illustrates a cross sectional view of the memory cell 900. As shown in FIG. 11, the NMOS program transistor 910 is located in first P Well 1110 over Deep N Well 1120. NMOS control capacitor 920 is located in second P Well 1130. The NMOS program transistor 910 and the NMOS control capacitor 920 are isolated by shallow trench isolation structures (designated with the letters "STI" in FIG. 11).

The advantageous embodiment of the memory cell 900 of the invention shown in FIGS. 9, 10 and 11 comprises one NMOS program transistor 910 and one NMOS control capacitor 920. As previously mentioned, the source, drain and well of the NMOS control capacitor 920 are connected together. The NMOS control capacitor 9320 serves as the erase/control gate capacitor.

The advantageous embodiment of the memory cell 900 of the invention shown in FIGS. 9, 10 and 11 has a higher coupling ratio. The higher coupling ratio is due to the fact that the NMOS control capacitor 920 will be in an accumulation mode when a positive bias is applied. This is in contrast to the PMOS control capacitor 320. When a positive bias is applied to the PMOS control capacitor 320, the PMOS control capacitor 320 is in depletion mode. Therefore the coupling ratio for the PMOS control capacitor 320 will not be as high as the coupling ratio for the NMOS control capacitor 920.

Figure 12:
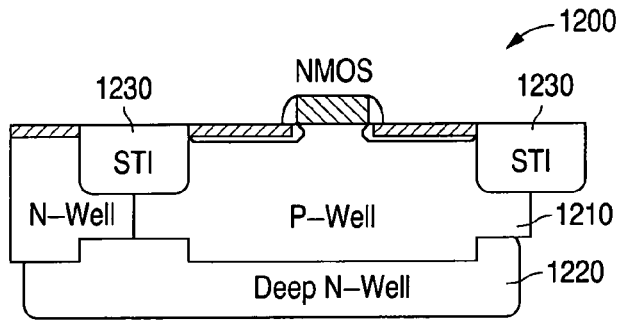
FIG. 12 illustrates a cross sectional view of an NMOS transistor manufactured on a deep n-well layer.

The present invention uses a Deep N Well layer. Deep N Well 520 ("DNW" 520) underlies the NMOS program transistor 310 in memory cell 300. Deep N Well 1120 ("DNW" 1120) underlies both the NMOS program transistor 910 and NMOS control capacitor 920 in memory cell 900. FIG. 12 illustrates a cross sectional view of an NMOS transistor 1200 manufactured on a Deep N Well layer. The P Well 1210 of NMOS transistor 1200 is formed over the Deep N Well layer 1220. The P Well 1210 is isolated by shallow trench isolation structure 1230 (designated by the letters "STI" in FIG. 12).

Figure 13:
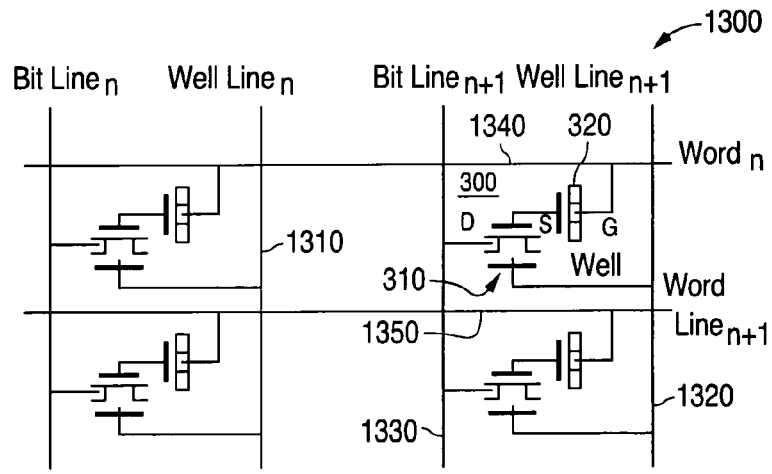
FIG. 13 illustrates a memory array architecture incorporating memory cells of the present invention.

FIG. 13 illustrates a memory array architecture 1300 incorporating memory cells of the present invention. The memory array architecture 1300 comprises a plurality of well lines.

FIG. 13 shows a first illustrative well line 1310 designated as "Well Line$_n$," and a second illustrative well line 1320 designated as "Well Line$_{n+1}$." The well lines (1310, 1320) are extra bit lines in the array 1300 that provide the well bias signal.

An exemplary memory cell 300 is shown in FIG. 13 between Bit Line$_{n+1}$ 1330, Word line$_n$ 1340, Word Line$_{n+1}$ 1350 and Word Line$_{n+1}$ 1320. The drain D of NMOS program transistor 310 is connected to Bit Line$_{n+1}$ 1330. The P Well of NMOS program transistor 310 is connected to Well Line$_{n+1}$ 1320. The gate of NMOS program transistor 310 is connected through the floating gate to the PMOS control capacitor 320. The PMOS control capacitor 320 is coupled to Word Line$_n$ 1340. The source of NMOS program transistor 310 is always grounded during write/erase/read operations. The memory array architecture 1300 is a common source array with extra bitlines for the Well Lines (Well Line$_n$ 1310, Well Line$_{n+1}$ 1320).

A memory cell 300 of the memory array architecture 1300 is programmed by applying a low/medium voltage on its word line, and by applying a high drain voltage on its bit line, and by applying a negative bias voltage on its well line. The source is grounded. To erase the memory cell 300, a high voltage is applied on its word line. This produces Fowler-Nordheim (FN) tunneling from the top side. To read the memory cell 300, a low voltage is applied to its bit line and to its word line.

Experimental tests of the memory cell 300 of the present invention have been performed. A standard NMOS transistor having a width of 10 microns and a length of 0.35 microns was used to test the NMOS program transistor 310. A test was made to determine the amount of gate current of the NMOS transistor (1) with a well bias voltage of minus two volts (−2 V), and (2) with no well bias voltage (i.e., a well bias voltage of zero volts (0 V). All other conditions were maintained the same during the two tests.

Figure 14:
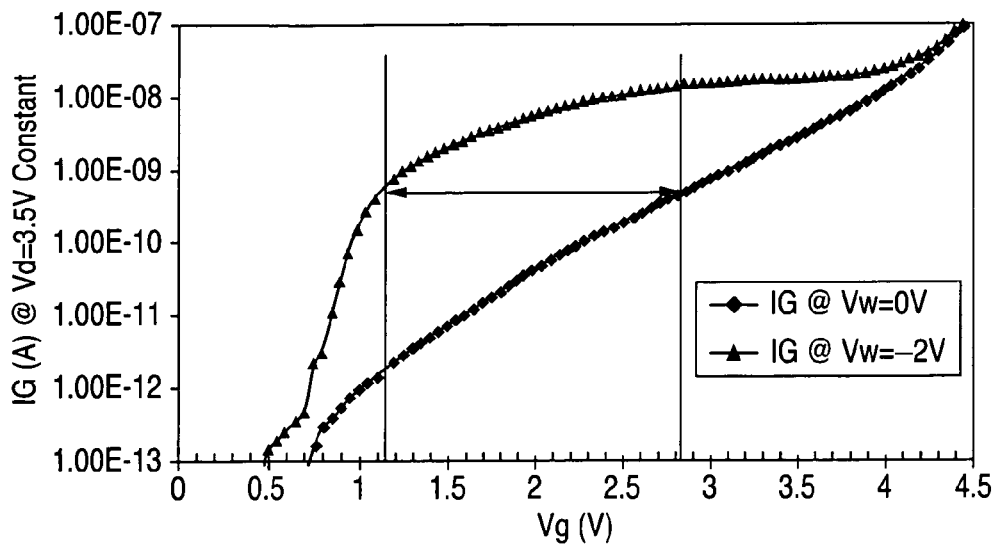
FIG. 14 illustrates a graph illustrating values of gate current under different values of well bias voltage.

FIG. 14 is a graph that shows the measured values of gate current under the two different values of well bias voltage (two volts and zero volts). When the P Well is biased with a well bias voltage of two volts (2 V) rather than with no well bias voltage (0 V), the gate current increases by two hundred fifty (250) times. That is, the gate current for the case of no well bias voltage (0 V) is about $2.0 \times 10^{-12}$ amperes. The gate current for the case of a well bias voltage of two volts (2 V) is about $5.0 \times 10^{10}$ amperes.

If one desires to keep the gate current at $5.0 \times 10^{-10}$ amperes to program the memory cells, one only needs a gate voltage (Vg) of about one and fifteen hundredths volt (1.15 V) and a well bias voltage of two volts (2 V). If the well bias is zero volts (0 V), then one would need a gate voltage (Vg) of about two and eight tenths volts (2.8 V).

This experimental result provides support that the requirement for gate coupling can be eliminated by apply a well bias voltage. This means that it is possible to eliminate the control gate (CG) capacitance and use only the erase capacitance. The erase capacitance will couple lower voltage during programming. The experimental result shows that by applying a well bias voltage the same gate current (Ig) can been maintained with a lower coupled gage voltage (Vg).

The drain voltage (Vd) was kept at three and one half volts (3.5 V) during the experimental test. For standard CMOS technology, as previously mentioned, the gate current (Ig) will be a combination of channel hot electrons, second channel hot electrons, and electrons from drain impact ionization.

Figure 15:
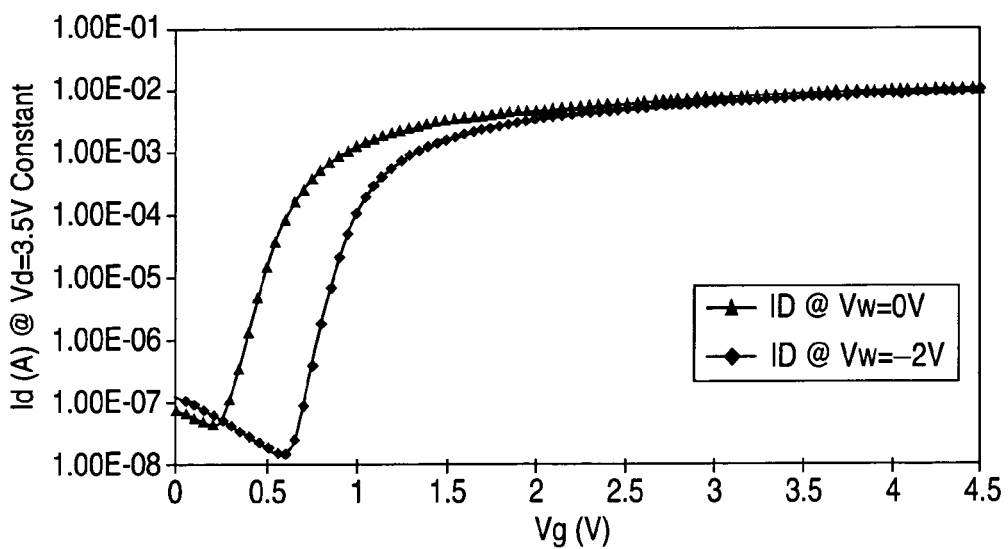
FIG. 15 illustrates a graph illustrating values of drain current under different values of well bias voltage.

FIG. 15 is a graph that shows the measured values of drain current under the two different values of well bias voltage (two volts and zero volts). FIG. 15 illustrates another advantage of using well bias voltage. The drain current (Id) decreased when the well bias voltage of minus two volts (−2 V) was applied. This is due to the fact that the threshold voltage Vth increased due to the well bias. Therefore, the drain current (Id) decreased.

The foregoing description has outlined in detail the features and technical advantages of the present invention so that persons who are skilled in the art may understand the advantages of the invention. Persons who are skilled in the art should appreciate that they may readily use the conception and the specific embodiment of the invention that is disclosed as a basis for modifying or designing other structures for carrying out the same purposes of the present invention. Persons who are skilled in the art should also realize that such equivalent constructions do not depart from the spirit and scope of the invention in its broadest form.

Although the present invention has been described with an exemplary embodiment, various changes and modifications may be suggested to one skilled in the art. It is intended that the present invention encompass such changes and modifications as fall within the scope of the appended claims.

What is claimed is:

1. A memory cell of an electrically erasable programmable read only memory, said memory cell comprising:
   a P channel metal oxide semiconductor (PMOS) control capacitor; and
   an N channel metal oxide semiconductor (NMOS) program transistor
   wherein a gate of said PMOS control capacitor and a gate of said NMOS transistor are connected together as a floating gate; and
   wherein said NMOS program transistor comprises: a P Well, a Deep N Well underlying said P Well, and shallow trench isolation structures that isolate said P well.

2. The memory cell as set forth in claim 1 wherein said PMOS control capacitor operates as an erase/control gate.

3. The memory cell as set forth in claim 1 wherein said Deep N Well reduces 1/f noise.

4. The memory cell as set forth in claim 1 wherein a size of said NMOS program transistor is greater than a size of said PMOS control capacitor.

5. The memory cell as set forth in claim 1 wherein said P Well of said NMOS program transistor is connected to a well bias voltage source that applies a well bias voltage to said P Well.

6. The memory cell as set forth in claim 5 wherein said well bias voltage source applies a well bias voltage to said P Well that is in the range of minus one volt to minus three volts.

7. The memory cell as set forth in claim 5 wherein applying said well bias voltage to said P Well enables the injection of (1) channel hot electrons, (2) second hot electrons initiated by channel hot electrons, and (3) drain impact ionization hot electrons into said floating gate of said NMOS program transistor.

8. The memory cell as set forth in claim 5 wherein applying said well bias voltage to said P Well reduces drain current of said NMOS program transistor.

9. A memory cell of an electrically erasable programmable read only memory, said memory cell comprising:
- an N channel metal oxide semiconductor (NMOS) control capacitor; and
- an N channel metal oxide semiconductor (NMOS) program transistor wherein a gate of said NMOS control capacitor and a gate of said NMOS program transistor are connected together as a floating gate; and
- wherein said NMOS program transistor comprises: a P well a Deep N Well underlying said P well, and shallow trench isolation structures that isolate said P well.

10. The memory cell as set forth in claim 9 wherein said NMOS control capacitor operates as an erase/control gate.

11. The memory cell as set forth in claim 10 wherein said NMOS control capacitor comprises: a second P Well, said Deep N Well underlying said second P Well, and shallow trench isolation structures that isolate said second P Well.

12. The memory cell as set forth in claim 9 wherein a size of said NMOS program transistor is greater than a size of said NMOS control capacitor.

13. The memory cell as set forth in claim 10 wherein said first P Well of said NMOS program transistor is connected to a well bias voltage source that applies a well bias voltage to said first P Well.

14. The memory cell as set forth in claim 13 wherein said well bias voltage source applies a well bias voltage to said first P Well that is in the range of minus one volt to minus three volts.

15. The memory cell as set forth in claim 13 wherein applying said well bias voltage to said first P Well enables the injection of (1) channel hot electrons, (2) second hot electrons initiated by channel hot electrons, and (3) drain impact ionization hot electrons into said floating gate of said NMOS program transistor.

16. The memory cell as set forth in claim 13 wherein applying said well bias voltage to said first P Well reduces drain current of said NMOS program transistor.

17. An electrically erasable programmable read only memory comprising a memory cell array in which each memory cell in said memory cell array comprises:
- a P channel metal oxide semiconductor (PMOS) control capacitor and an N channel metal oxide semiconductor (NMOS) program transistor in which a gate of said PMOS control capacitor and a gate of said NMOS program transistor are connected together as a floating gate;
- wherein said NMOS program transistor comprises a P Well, a Deep N Well underlying said first P Well, and shallow trench isolation structures that isolate said P Well; and
- wherein said P Well of said NMOS program transistor is connected to a well bias voltage source that applies a well bias voltage to said P Well.

18. The electrically erasable programmable read only memory as set forth in claim 17 wherein said memory cell array comprises a plurality of well lines, each well line of which is capable of providing a well bias voltage to a portion of said plurality of said memory cells.

19. An electrically erasable programmable read only memory comprising a memory cell array in which each memory cell in said memory cell array comprises:
- an N channel metal oxide semiconductor (NMOS) control capacitor and an N channel metal oxide semiconductor (NMOS) program transistor in which a gate of said NMOS control capacitor and a gate of said NMOS program transistor are connected together as a floating gate;
- wherein said NMOS program transistor comprises a P Well, a Deep N Well underlying said first P Well, and shallow trench isolation structures that isolate said P Well; and
- wherein said P Well of said NMOS program transistor is connected to a well bias voltage source that applies a well bias voltage to said P Well.

20. The electrically erasable programmable read only memory as set forth in claim 19 wherein said memory cell array comprises a plurality of well lines, each well line of which is capable of providing a well bias voltage to a portion of said plurality of said memory cells.

* * * * *